United States Patent [19]
Alexander et al.

[11] Patent Number: 5,363,334
[45] Date of Patent: Nov. 8, 1994

[54] WRITE PROTECTION SECURITY FOR MEMORY DEVICE

[75] Inventors: Samuel E. Alexander, Gilbert; Richard J. Fisher, Phoenix; Kent D. Hewitt, Tempe, all of Ariz.

[73] Assignee: Microchip Technology Incorporated, Chandler, Ariz.

[21] Appl. No.: 41,068

[22] Filed: Apr. 10, 1993

[51] Int. Cl.$^5$ .............................................. G11C 7/00
[52] U.S. Cl. .................................. 365/218; 365/195; 365/230.03
[58] Field of Search .................... 365/218, 195, 230.03, 365/96, 189.07, 189.12

[56] References Cited
U.S. PATENT DOCUMENTS

| | | | |
|---|---|---|---|
| 4,931,993 | 6/1990 | Urushima | 365/195 |
| 4,975,878 | 12/1990 | Boddu | 365/228 |
| 5,084,843 | 1/1992 | Mitsuishi | 365/195 |

*Primary Examiner*—Eugene R. LaRoche
*Assistant Examiner*—A. Zarabian
*Attorney, Agent, or Firm*—O'Connor, Anderson, Westover, Killingworth and Geshears

[57] ABSTRACT

An erasable programmable memory device has a number of contiguous data storage cells forming the data memory of the device. The address of one of these data storage cells is stored to designate it as a cell which is to be write protected so that its contents may not thereafter be erased or overwritten. Information is also stored to identify the total number of contiguous data storage cells to be similarly write protected commencing with the cell whose address is stored to designate write protection. The contents of the designated and identified cells are then made permanent. Write protection of the designated and identified cells is accomplished by comparing each write operation address with the addresses of the data storage cells encompassed within the protected area, and if it is within that area, aborting the write operation.

17 Claims, 6 Drawing Sheets

CONTROL SEQUENCE BIT ASSIGNMENTS

| CONTROL BYTE | | ADDRESS BYTE 1 | | ADDRESS BYTE 0 | SECURITY BYTE | | | |
|---|---|---|---|---|---|---|---|---|
| SLAVE ADDRESS | DEVICE SELECT | R/W | S | X | X | A12–A8 | A7–A0 | E/W | R | X | X | BLK CNT |
| 7 | | 0 | 7 | | | 4 | 0 | 7 | 0 | 7 | 6 | 5 | 4 | 3 | 0 |

FIG. 8A

SECURITY WRITE (BLOCK ONE)

| ADDRESS | DEVICE SELECT | R/W | S | X | X | A12–A8 | A7–A0 | E/W | R | X | X | BLK CNT |
|---|---|---|---|---|---|---|---|---|---|---|---|---|
| 1010 | 000 | 0 | 1 | X | X | 0000X | XXXXXXXX | 0 | 0 | X | X | 0001 |

0000X → BLOCK SELECT BITS

FIG. 8B

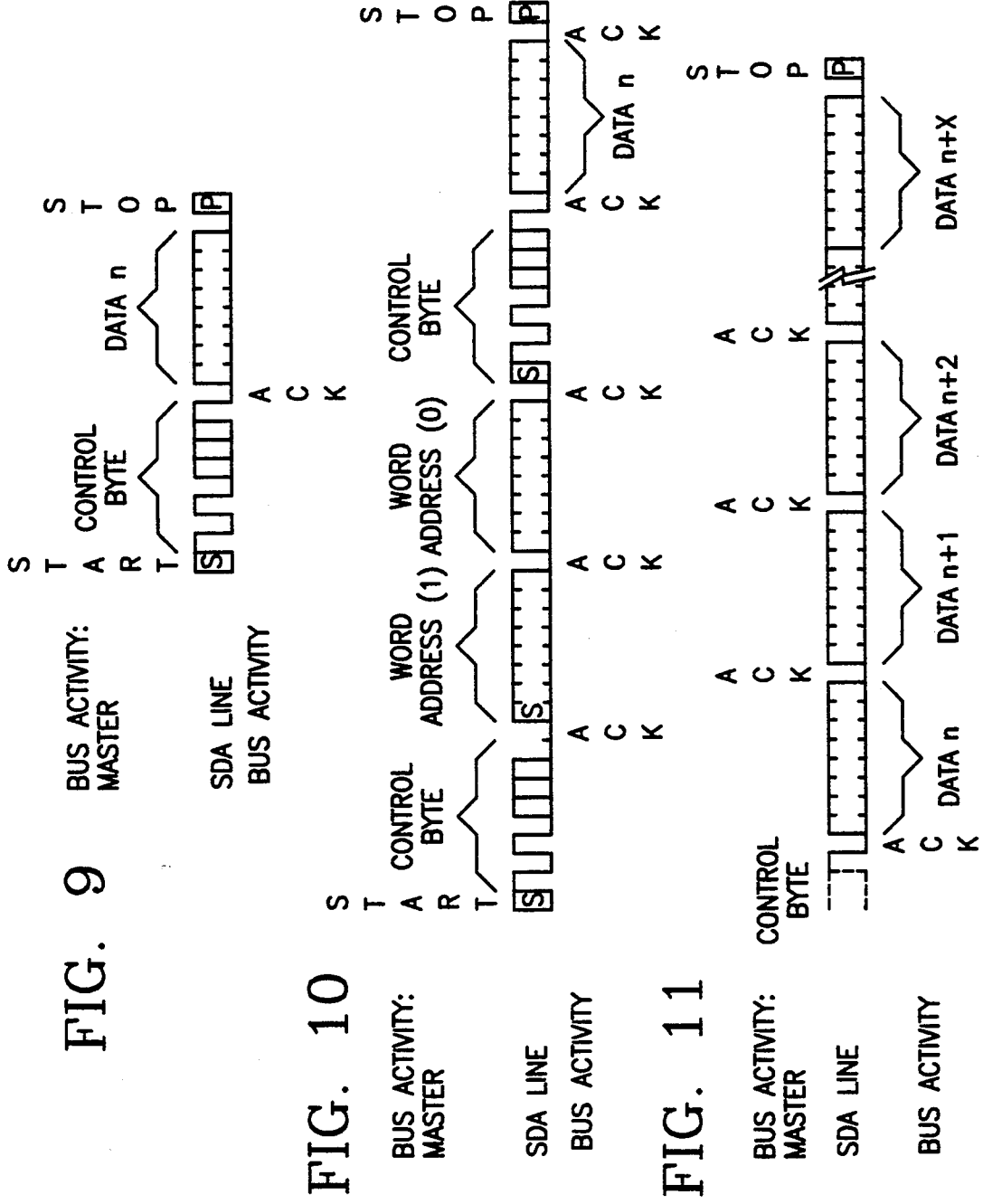

WRITE PROTECTION SECURITY FOR MEMORY DEVICE

BACKGROUND OF THE INVENTION

The present invention relates generally to semiconductor integrated circuit (IC) memory chips or devices, and more particularly to erasable programmable memory devices such as electrically erasable (alterable) programmable read only memories (EEPROMs).

EEPROM devices have the distinct advantage of allowing data to be written and rapidly erased electrically many times over, to permit a user to change the stored data at will while the device is in circuit. In contrast, the older PROM-type devices employ fusible links in which dam is stored according to the condition of the fuses at intersections of the memory array, i.e., the condition of whether or not a fuse is blown. As such, a PROM device is, for all intents and purposes, programmable only once (that is, is non-erasable) since a blown fuse is not reparable.

Another type of erasable programmable memory, the EPROM device, requires exposure of the unhoused structure to ultraviolet (UV) light to change the electrical characteristics of a charged element in order to obtain erasure. Typically, the EPROM is housed in a windowed package (e.g., a ceramic package having a quartz window to expose the silicon), although a more recent version dubbed as "one time programmable" (OTP) is packaged in plastic without a window. As the name indicates, the windowless variety can be programmed only once. For the usual windowed EPROM that has been programmed, however, reprogramming is a major effort. If installed, the device must be removed from its in-system circuit, exposed to UV for a sufficient period of time (typically several hours) to assure complete erasure of the stored data, reprogrammed electrically, and then reinstalled in circuit.

The use of EEPROM devices avoids the need to subject the memory to long periods of outage for erasure. This, then, is the memory device of choice for applications where fast storage changes are required. In the EEPROM structure, a pair of polysilicon gates are separated by a silicon dioxide layer. The oxide also extends below the lower gate to separate it from underlying p-type silicon substrate in which a channel may be established between implanted heavily doped n-type source and drain regions. The oxide thickness between the lower gate and the silicon typically ranges up to about 100 angstroms, which is considerably less than the gate oxide thickness used for EPROM structures.

In operation of the EEPROM, a voltage of suitable magnitude applied across the very thin gate oxide layer induces tunneling of electrons from the substrate to the lower gate. A logical 1 is stored (written) when a write voltage is applied to the upper gate, thus inducing a charge on the lower gate that prevents a channel from forming during a read operation. A reversal of the write voltage causes erasure.

In erasable programmable memory devices such as EEPROMs, where the internal memory is composed of contiguous memory blocks of equal capacity (size), many applications exist in which the user desires to maintain security for some or all of the memory blocks. For example, the user may wish to "write protect" certain ones of the blocks to prevent the data stored in those blocks from being erased and written over.

Prior schemes for offering write protection have had disadvantages. For example, hardware write protection has been offered in which a pin of the device has been made high to provide write protection of the EEPROM, or low to permit the EEPROM to be written to. The entire memory is write protected, rather than simply selected blocks. In a programmable write protection scheme, an address value is stored in the device and every address equal to or greater than the programmed address is write protected. However, this scheme requires a large circuit overhead.

Accordingly, it is a principal object of the present invention to provide improvements in security for erasable programmable memory arrays.

A more specific object of the invention is to provide improved write protection for erasable programmable memory devices of memory size or capacity made up of contiguous blocks of memory, where selected blocks are to be protected.

SUMMARY OF THE INVENTION

The present invention provides a simple security scheme by which any number but less than all of the contiguous, equally sized blocks of memory making up the total data memory capacity of an erasable programmable memory device such as an EEPROM are selectively write protected.

In the exemplary environment of a 64K-bit serial EEPROM, the data memory is composed of 16 blocks, each having a capacity of 4K bits. The security scheme defines the first (and perhaps the only) block to be write protected, and also defines the number of contiguous blocks to be write protected commencing with that security start block. The address of the selected security start block is written to a first four-bit register, and may be any one of the sixteen blocks of memory. The desired total number (at least one, and up to fifteen) of contiguous blocks to be write protected is written to a second four-bit register. After the number of blocks is entered into the second register, one or more configuration fuse(s) may be "blown" to open the data paths to the two registers, to prevent subsequent alteration of the contents of the two registers.

Whenever a write operation is attempted, a compare step is performed to determine whether the address of the write operation is within the protected (secured) area of the overall memory. If it is, the write operation is aborted.

Therefore, another object of the invention is to provide a security system for an erasable programmable memory device having a plurality of contiguous data storage cells forming the data memory of the device, by incorporating in the device means for storing the address of one of the contiguous data storage cells at which write protection is to be commenced to thereafter prevent the contents of that cell from being erased or overwritten, further means for storing the total number of the contiguous data storage cells over which write protection is to be provided so that thereafter none of the contents of any cell among those contiguous cells can be erased or overwritten, and means for selectively preventing the stored contents of at least one of the first and second means from being altered.

Another object of the invention is to provide a write protected EEPROM which has a relatively large capacity data memory divided into smaller equal capacity memory blocks and means for writing data selectively into the memory blocks, by providing the EEPROM with means for identifying one or more but not all of the memory blocks for substantially permanent data storage without erasure, means for preventing erasure of data from the identified memory block(s) while permitting the memory blocks not so identified to be electrically erased and rewritten at will, and means for selectively preventing access to the identity of the identified memory block(s).

A further object of the invention is to provide a related method for write protecting selected memory blocks of an erasable programmable memory device to prevent erasure and rewriting of data in the selected memory blocks.

BRIEF DESCRIPTION OF THE DRAWINGS

The above and still further objects, features, aspects and attendant advantages of the invention will be made clearer by considering the following detailed description of the best mode presently contemplated for implementing and practicing the invention, taken in conjunction with the accompanying drawings in which:

FIGS. 8A and 8B are diagrams of the control sequence bit assignments and the security write, respectively, in the exemplary embodiment for write protected block selection;

FIG. 9 is a bit stream diagram useful to explain a current address read operation in the EEPROM device;

FIG. 10 is a bit stream diagram useful to explain a random read operation in the EEPROM device; and FIG. 11 is a bit stream diagram useful to explain a sequential read operation in the EEPROM device.

DETAILED DESCRIPTION OF THE PREFERRED EMBODIMENT AND METHOD

Figure 1:
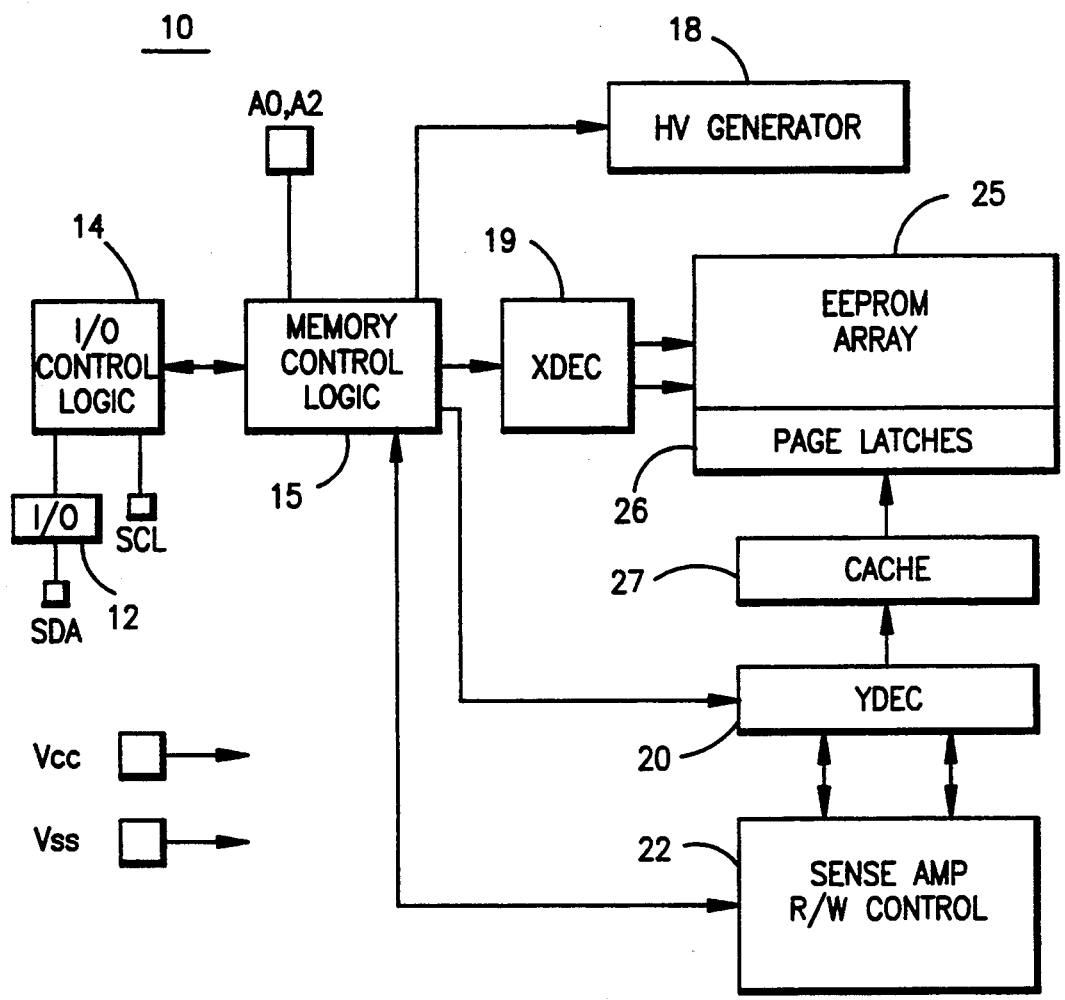
FIG. 1 is a block diagram of a serial EEPROM device in which the preferred embodiment of the invention is implemented.

In the preferred embodiment, the invention is implemented in a 64K (8K×8) low voltage serial EEPROM 10 (FIG. 1) especially suited for low power applications, such as are found in the personal communications market (e.g., cellular telephones), data acquisition, so-called "smart cards", and so forth.

EEPROM 10 includes pins A0, ... An, which in this example are A0, A1 and A2 user configurable chip selects, and pins SDA (serial address/data input/output (I/O)) and SCL (serial clock). The A0, A1 and A2 chip address inputs are used by the device for multiple device operation and conform to the I2C bus standard. The level on these pins defines the address block occupied by the device in an address map. This address may then be compared to the corresponding bits in the slave address (the situation in which the device is used as the slave) for selecting the appropriate device from among the multiple devices.

The SDA pin is bidirectional and used to transfer addresses and data into the device, and data out of the device. The pin is an open drain terminal. For normal data transfer, the SDA is allowed to change only during SCL low. Changes during SCL high are reserved for indicating start and stop conditions (described below). The SCL serial clock input is used to synchronize the data transfer from and to the device.

Pins $V_{SS}$ and $V_{CC}$ are for electrical ground and power supply (e.g., +1.8 V to 5.5 V), respectively.

The device has an I/O interface 12 and I/O control logic 14 that communicates with memory control logic 15. Control logic 15 supplies inputs to HV (high voltage) generator 18, XDEC (X-line decoder) 19, YDEC (Y-line decoder) 20, and also communicates with sense AMP (amplifier) R/W (read/write) control 22. The XDEC controls EEPROM array 25 with page latches 26 that are controlled by cache 27 and in turn by YDEC 20. The latter also communicates with sense AMP R/W control 22.

Device 10 is fabricated using CMOS process technology to render it more suitable for low power nonvolatile code and data applications. The device is conveniently packaged in an 8 pin (A0, A1, A2, $V_{SS}$, $V_{CC}$, NU (not used), SCL and SDA) DIP (dual in-line package) or SOIC (small outline integrated circuit) package.

Figure 2A:
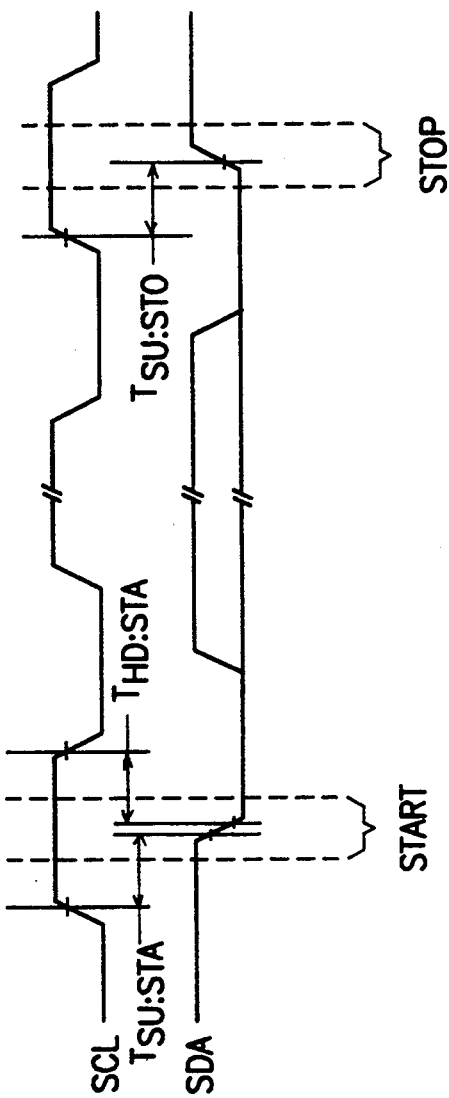
FIGS. 2A and 2B are timing diagrams for the data transmission bus of the device of FIG. 1.
Figure 2B:
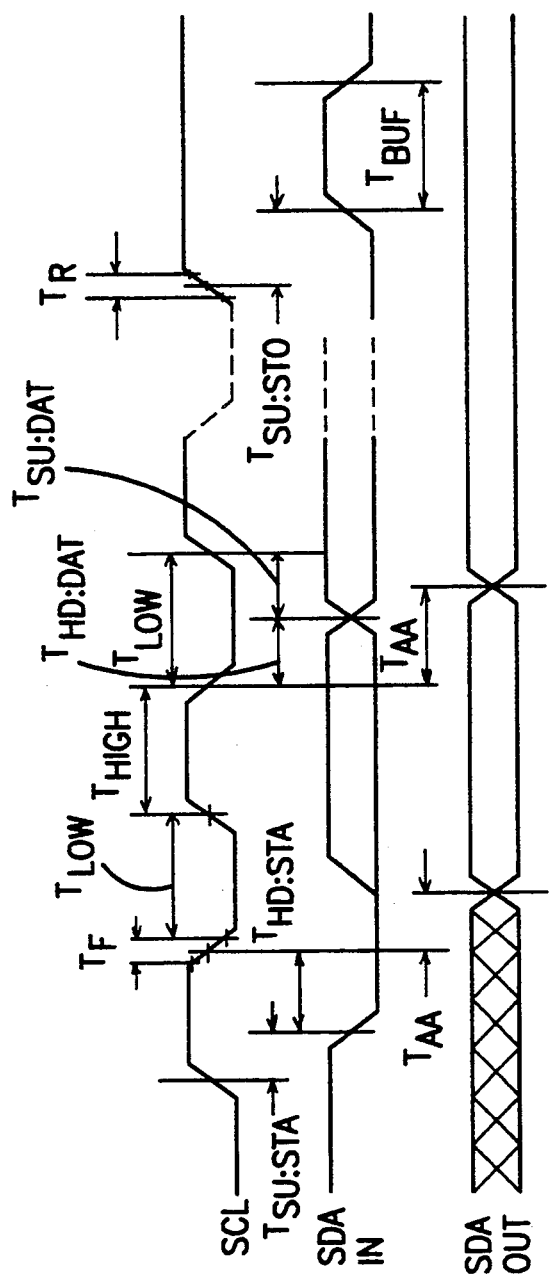

The EEPROM supports a bidirectional two wire bus and data transmission protocol. Bus timing start/stop and bus timing data are illustrated in FIGS. 2A and 2B, respectively. In the protocol, a transmitter sends data onto the bus, and a receiver receives the data. The bus is controlled by a master device that generates the serial clock SCL, controls the bus access, and generates start and stop conditions for data transfer. The EEPROM acts as a slave device, and like the master, can operate as transmitter or receiver, but the master device determines which of those modes is activated.

FIGS. 2A and 2B assume an exemplary clock frequency of 400 KHz, with data transfer start and stop conditions generated during selected clock high times $T_{HIGH}$ (e.g., minimum of 600 nanoseconds, ns). The clock high time, and the clock low time $T_{LOW}$ (e.g., 1300 ns), lie between the approximate midpoints of the clock rise time $T_R$ (e.g., maximum of 300 ns) and fall time $T_F$ (e.g., max 300 ns), and vice versa, respectively. The start condition hold time $T_{HD:STA}$ (e.g., min 600 ns) is the period after which the first clock pulse is generated. A start condition setup time $T_{SU:STA}$ (e.g., min 600 ns) is only relevant for repeated start conditions. Analogous considerations exist for stop condition hold time $T_{HD:STO}$ and setup time $T_{SU:STO}$ (e.g., min 600 ns).

Data input hold time and data input setup time are labeled as $T_{HD:DAT}$ (e.g., min 0 ns) and $T_{SU:DAT}$ (e.g., min 100 ns) respectively, in FIG. 2B. When the EEPROM device 10 acts as a transmitter, it must provide an internal minimum delay time $T_{AA}$ (e.g., max 900 ns) to bridge an undefined region (e.g., min 300 ns) of the failing edge of SCL to avoid unintended generation of start and stop conditions. The bus must be tree for a time interval designated $T_{BUF}$ (e.g., min 1300 ns) before a new transmission can start.

The bus protocol of this 64K serial EEPROM device requires that:
  data transfer may be initiated only when the bus is not busy; and
  during data transfer, the data line must remain stable whenever the clock line is high; changes in the data line while the clock line is high will be interpreted as a start or a stop condition.

Figure 3:
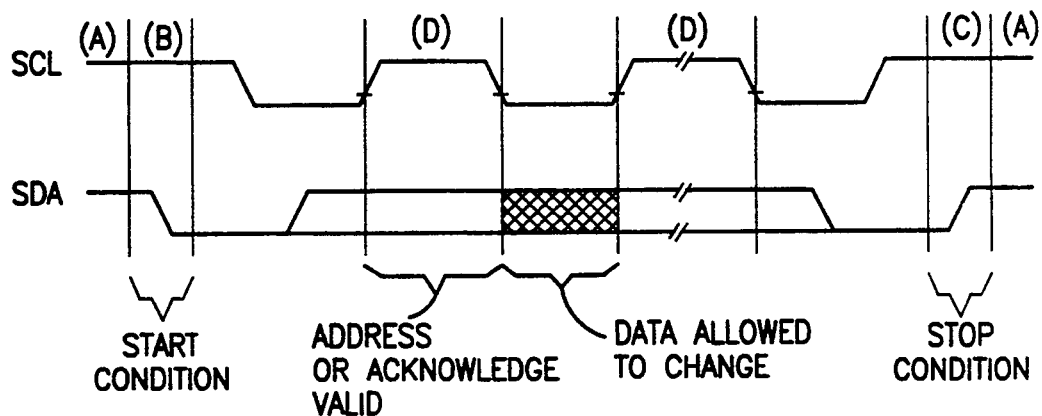
FIG. 3 is a diagram of the data transfer sequence on the serial bus of the EEPROM device.

This protocol in turn leads to the definition of the following bus conditions. The letters A, B, C and D in this part of the description refer to like characters in the illustrative data transfer sequence on the serial bus of FIG. 3. The bus is not busy (A) when both the data (SDA) and clock (SCL) lines remain high. A start data transfer (start condition, B) is determined by a high to low transition of the SDA line while the SCL line is high. All commands must be preceded by a start condition. A stop data transfer (stop condition, C) is determined by a low to high transition of the SDA line while the SCL line is high. All operations must be ended with a stop condition. In other words, each data transfer is initiated with a start condition and terminated with a stop condition.

The state of the data (SDA) line represents valid data (D) when, after a start condition, the data line is stable for the duration of the high period of the clock (SCL) signal. The data on the SDA line may be changed only during the low period of the SCL signal. One clock pulse occurs per bit of data. The number of data bytes transferred between the start and stop conditions is determined by the master device. An acknowledge is generated by the addressed receiving device after the reception or each byte.

Figure 4:
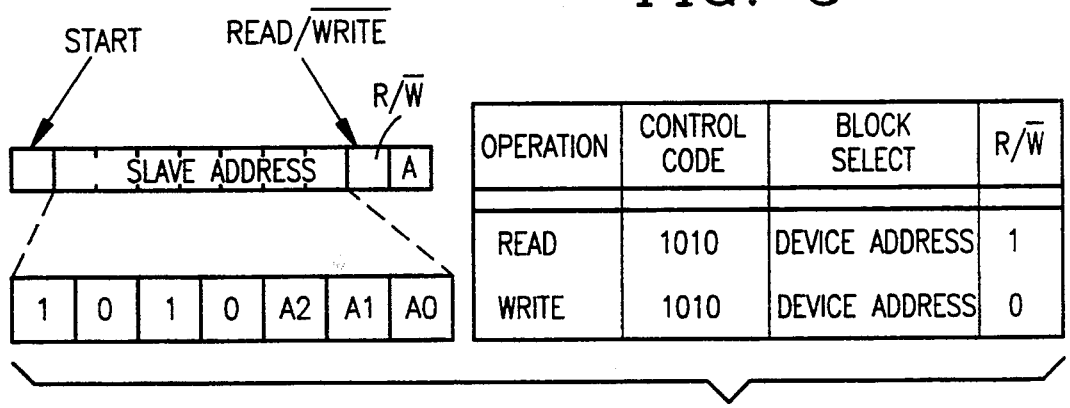
FIG. 4 is a chart illustrating the control byte allocation used for device addressing and operation.

The first byte received from the master device after the start condition is a control byte. The control byte allocation is illustrated in the chart of FIG. 4, and, in this example, the byte includes a four bit control code, set as 1010 binary for read and write operations. The next three bits of the byte are device select bits used by the master device to select which of up to eight devices is to be accessed in the system. These three bits are compared to the A0, A1 and A2 pins on the device. Only one device would be selected at a given time because each device on the bus has its A0, A1 and A2 pins configured uniquely on the bus.

The last bit (R/W) of the control byte defines the operation to be performed, i.e., read or write. If this bit is set to a 1, a read operation is selected; if set to a 0, a write operation is selected. The bit designated A in FIG. 4 is an acknowledge bit; the receiver acknowledges receipt of each transmitted data byte by pulling the SDA line low. An acknowledge is given after each byte transmitted in either direction.

The least significant thirteen bits of the next two bytes from the master device define the address of the byte on which the device will perform subsequent read or write operations.

Following a start condition, EEPROM device 10 monitors the SDA line to check the device type identifier transmitted by the master. On receiving a 1010 code and the device select bits, the slave device so selected outputs an acknowledge signal on the SDA line, and a read or write operation is selected depending on the state of the R/W bit.

Figure 5:
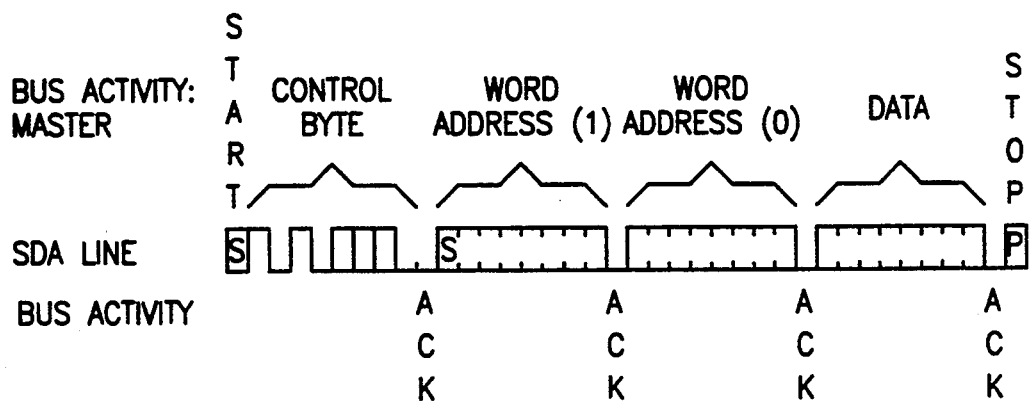
FIG. 5 is a bit stream diagram useful to explain a byte write operation in the EEPROM device.

In a byte write operation (FIG. 5), after the start condition from the master, the device code (4 bits), device select (3 bits) and R/W bit, which is a logic low (0) are placed onto the bus by the master transmitter. This indicates to the addressed slave receiver that a byte with a word address will follow the control byte, after the slave generates an acknowledge bit during the appropriate clock cycle.

The next byte transmitted by the master, then, is the first byte of the word address, which is written into the address pointer of the device. After device 10 receives another byte or bytes to the least significant address byte and issues an acknowledgement, the master device transmits a data word to be written into the addressed memory location. This is followed by another acknowledge signal from the slave (device 10) and a generation of a stop condition by the master. In response, the internal write cycle is initiated, during which the EEPROM device generates no further acknowledge signals.

Figure 6:
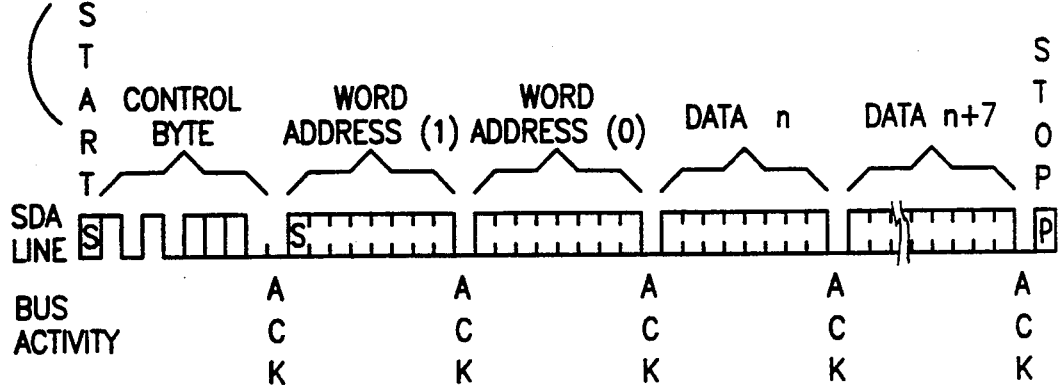
FIG. 6 is a bit stream diagram useful to explain a page write operation in the EEPROM device.

In the page write operation (FIG. 6), the write control byte, word address and first data byte are transmitted to the serial EEPROM device 10. This is the same as described above for a byte write. However, at that point (after acknowledgement of the data byte) the master transmits up to eight pages of eight data bytes, for example, where the cache is eight pages by eight bytes/page, as in this embodiment. These are temporarily stored in the on-chip 64-byte page cache 27, to be written into the memory of device 10 after the master transmits a stop condition. The lower order address pointer bits are internally incremented, while the higher order word address bits are held constant.

If more than eight bytes are generated before a stop condition, the pointer is incremented to point to the next line in the cache. This can continue up to eight times (eight lines, 64 bytes). The write cache wraps around until a stop condition occurs, at which time a write operation is performed to write the last 64 bytes received into the cache. The cache will continue to capture data until a stop condition occurs or the page write operation is aborted.

When writing data to the EEPROM device, the internal write cycle is executed as an automatic erase-then-write cycle. This total write cycle time interval $T_{WR}$ (erase plus write) is typically 2 milliseconds (ms) in length, with a maximum length of 10 ms, for a single page of eight bytes. The total time required for loading a greater number of pages into write cache 27 is the single page $T_{WR}$ multiplied by the total number of pages (up to eight) being written.

Figure 7:
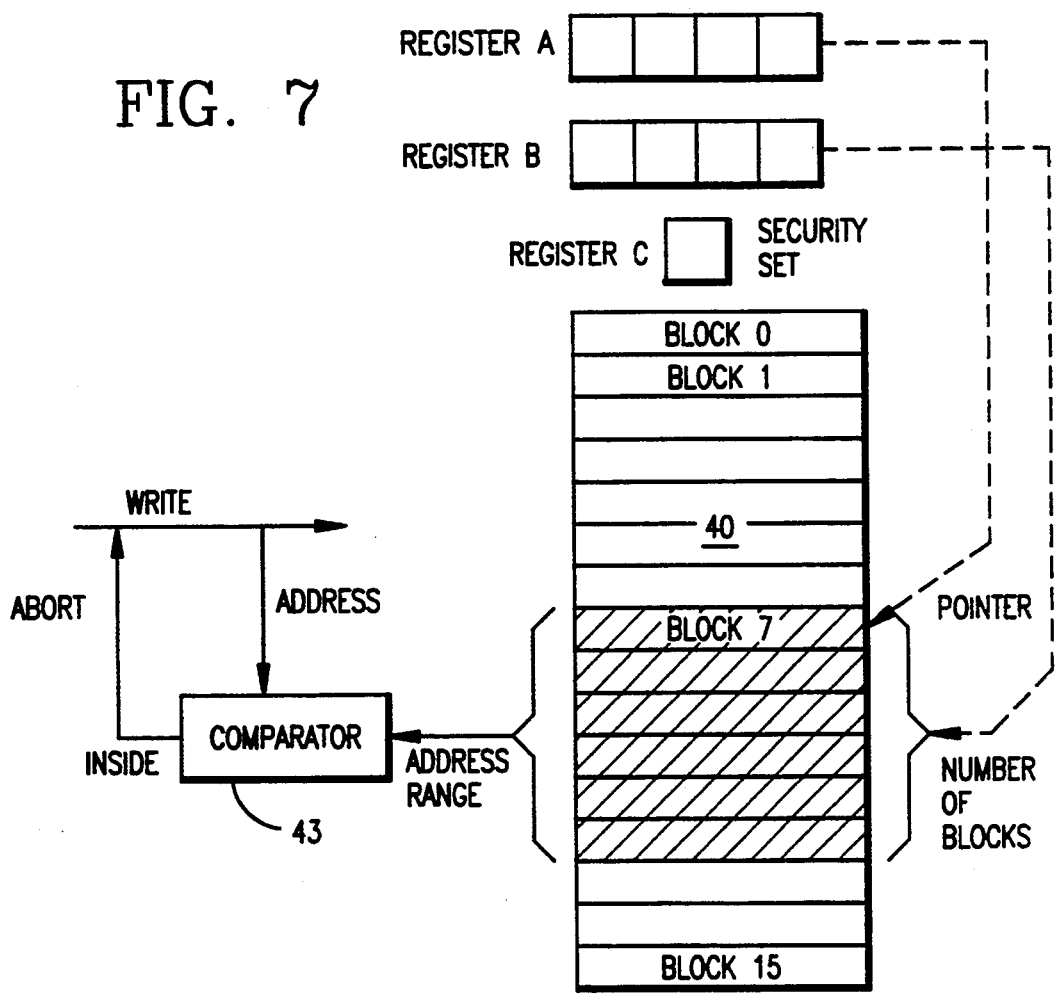
FIG. 7 is a simplified diagram illustrating selection of memory blocks to be secured by write protection.

Referring to FIG. 7, assume that it is desired to program the erasable programmable 64K EEPROM to render one or more contiguous blocks of the memory 40 secure. Typically, this programming would be performed by the customer of the EEPROM supplier for purposes of the end product application in which the EEPROM is used, or by the EEPROM factory at that customer's direction. In this embodiment, the 64K memory 40 is divided into sixteen blocks of 4K bits each. If blocks 7 through 12 inclusive are to be designated for write prote to be secured (the security start block), here block 7, is stored in a shift register A. The register provides a pointer to the designated security start block.

The total number of contiguous blocks of memory to be secured (here, six), commencing with the security start block, is then entered into a second shift register B. This number must always be non-zero and should range from one block to fifteen blocks, depending on the number of blocks to be write protected. Of course, if all sixteen blocks of data memory were intended to be write protected so that their contents could not be altered, a less expensive factory programmed ROM or a PROM would be selected for the particular application, rather than an EEPROM. Each of registers A and B is a four-bit register capable of storing the binary address of the security start block and the number of blocks to be write protected, respectively.

Once the write protected blocks are identified by the information stored in the registers, the destination for each write operation is examined. Specifically, a compare step is performed by comparator 43 in which the address of the memory block where the erase or write is to be done is compared in sequence with the addresses of the memory blocks in the write protected area. If the address for the attempted write is the same as any address in the write protected area, the comparator generates an abort signal and the write operation is aborted before the erase or write operation is performed.

After registers A and B have been programmed to designate the protected area of data memory 40, the two registers may be rendered inaccessible to prevent alteration of either the security start block address or the number of contiguous blocks secured. To that end, one or more sets of configuration fuses that act as lockout fuses are blown to "open" the data paths to the two registers. In practice, each lockout fuse is modeled by a one bit register (e.g., register C of FIG. 7) that may be set or cleared by writing an appropriate bit to the register. In the preferred embodiment, the fuse consists of nonvolatile EEPROM memory cells which are programmed or erased to store the value of the fuse.

In the lockout fuse operation, whenever data is written to registers A and B by a security write command (see FIG. 8B and accompanying description below), register C, constituting a fuse, is written to at the same time. Register C was previously cleared, indicating that no security has been programmed, but is written to following the security write command. At any subsequent attempt to rewrite the security bits, the written (secure) state of register C prevents alteration of registers A and B through the circuit. The customer of the EEPROM device supplier, such as an original equipment manufacturer, can thereby designate that portion of the device memory which is to be made impervious to alteration by users of its end product.

FIG. 8A illustrates control sequence bit assignments for selection of various options in the EEPROM device. The control byte includes slave address, device select and read or write (R/W) selection. This is followed by two eight-bit (0–7) address bytes, and an eight-bit security byte. In one option, the device provides the security scheme described above by which one or more contiguous blocks of memory are made write protected.

The write sequence includes a bit—bit 7 of the first address byte—for enabling this security protection scheme. When that bit is set to a one, during a write sequence the first byte following the address (denoted as the security byte in FIG. 8A) defines the security. The pointer to the starting 4K block to be write protected is contained in the block select bits (bits A12–A9 in FIG. 8B) of address byte 1. The security byte includes an erase/write (E/W) flag, a read bit which will be 0, two "don't care" bits, and a four bit code for determining the number of 4K blocks to be protected.

During a normal write sequence, if an attempt is made to write to or across a protected block, the device ignores the write sequence to this block. Any data written to unprotected blocks will be written, even though a security boundary may be crossed.

FIG. 8B illustrates an exemplary security write operation for a block (constituting block zero) in the programming process. Bit 7 of the security byte is set high (1) and bit 6 of the security byte is set low (0) to indicate that a security write operation is being performed. As in the FIG. 8A example above, the next two bits are "don't care" bits, the last four bits define the number of blocks to be secured (constituting one block), and the starting block to be secured is pointed to by the block select bits of address byte 1.

Read operations are initiated in the same way as write operations except that the R/W bit of the slave address is set to 1 rather than 0. The three types of read operations for the EEPROM device 10 are (1) current address read, (2) random read, and (3) sequential read.

In a current address read operation (FIG. 9), an address pointer within memory control logic 15 (FIG. 1) of device 10 maintains the address of the last word accessed, which is internally incremented by one after each read operation. That is, if the previous access in a read or write operation was to an address n, where n is any permitted address, the next current address read operation will access data from address n+1. The device (slave) issues an acknowledge and transmits an eight-bit data word from the indicated address in response to receipt of the slave address with R/W bit set to 1. The master then generates a stop condition and the device discontinues transmission.

In a random read operation (FIG. 10), the master is allowed to access any memory location in a completely random manner. The word address is first set by sending it to the EEPROM device as part of a write operation, after which the master generates a start condition following the acknowledge from the device. As a result, the write operation is terminated but the internal address pointer is already set. The control byte is again issued by the master, except that now the R/W bit is set to 1. Consequently, the device acknowledges and transmits the eight-bit data word or the applicable address. The master then generates a stop condition and the device discontinues transmission.

In a sequential read operation (FIG. 11 ), reads are initiated in the same way as in the random read operation except that after the first data byte is transmitted by the EEPROM, the master issues an acknowledge rather than a stop condition. This directs the EEPROM to transmit the next sequentially addressed data word. For sequential reads, the internal address pointer of the device is incremented by one after each data word transmission, so the next acknowledge from the master results in transmission of the next data word in the memory address sequence. The address pointer thereby allows the entire memory contents to be serially read during one read operation.

A preferred embodiment constituting the best mode presently contemplated for practicing the invention has been described. However, it will be apparent to those skilled in the art that modifications may be made without departing from the true spirit and scope of the invention. Accordingly, it is intended that the invention shall be limited only as required by the appended claims and the rules and principles of applicable law.

What is claimed is:

1. A security system for an erasable programmable memory device, comprising a plurality of contiguous data storage cells forming the data memory of the device, first means for storing the address of one of the contiguous data storage cells at which write protection is to be commenced to thereafter prevent the contents of that cell from being erased or overwritten, second means or storing the total number of the contiguous data storage cells over which write protection is to be provided so that thereafter none of the contents of any cell among those contiguous cells can be erased or overwritten, and means for selectively preventing the stored contents of at least one of the first and second means from being altered.

2. The invention of claim 1, in which the means for selectively preventing comprises means for preventing the stored contents of both of the first and second means from being altered.

3. The invention of claim 1, in which the means for selectively preventing comprises an irreparable fuse.

4. The invention of claim 1, in which the means for selectively preventing comprises a fuse in the form of a non-volatile flip-flop whose state determines whether the fuse is on or off.

5. The invention of claim 1, in which each of the first and second means comprises a shift register.

6. The invention of claim 1, in which the erasable programmable memory device is an EEPROM, and the plurality of contiguous data storage cells are sequentially addressed blocks of data memory of equal storage capacity.

7. A write protected erasable programmable memory device, comprising a plurality of data memory means of equal storage capacity for having data written thereto and read therefrom and having sequential addresses for access, first means for designating the address of one of the data memory means in which data is to be write protected so that once written to that one data memory means the data therein is to be permanently stored without alteration, second means for designating a number of successive data memory means whose addresses commence at and sequentially follow that of said one data memory means to be similarly write protected, means for selectively preventing the designations by the first and second means from being changed, and means for aborting attempts to write to any of the write protected data memory means.

8. The invention of claim 7, in which the erasable programmable memory device is an EEPROM.

9. The invention of claim 7, in which each of the first means, the second means, and the means for selectively preventing comprises a register.

10. The invention of claim 7, in which the means for aborting comprises means for comparing the address of the data memory means for the attempted write to the addresses of the write protected data memory means.

11. A write protected electrically erasable programmable read only memory (EEPROM) device, comprising a relatively large capacity data memory divided into smaller equal capacity memory blocks, means for writing data selectively into the memory blocks, means for identifying one or more but not all of the memory blocks for permanent data storage without erasure, and means for preventing erasure of data from the identified one or more memory blocks while permitting the memory blocks not so identified to be electrically erased and rewritten at will without altering the location of data contents of the identified one or more memory blocks during erasure of the memory blocks not so identified.

12. The invention of claim 11, in which the memory blocks are contiguous with sequential addresses for access, the means for identifying includes separate registers for storing information identifying the one or more memory blocks for which erasure of data is to be prevented, and the means for preventing erasure includes comparator means for comparing each address for which erasure of data is sought with addresses of said identified one or more memory blocks.

13. A method of write protecting selected memory blocks of an erasable programmable memory device to prevent erasure and rewriting of data in the selected memory blocks, in which the device has a relatively large capacity memory divided into the smaller equal capacity memory blocks some but not all of which are to be selected for write protection, the method comprising the steps of:

writing data selectively into the memory blocks, identifying one or more but not all of the memory blocks for permanent data storage without erasure, and preventing erasure of data from the identified one or more memory blocks while permitting the memory blocks not so identified to be electrically erased and rewritten at will without altering the location of data contents of the identified one or more memory blocks during erasure of the memory blocks not so identified.

14. The method of claim 13, in which:
the step of identifying includes storing the addresses of the memory blocks selected for permanent data storage.

15. The method of claim 13, in which:
the step of preventing erasure of data from the identified one or more memory blocks includes assessing whether or not an attempted erasure or write of data is directed to a memory block selected for permanent data storage.

16. The invention of claim 11, further including means for selectively blocking access to the identity of the identified memory blocks.

17. The method of claim 13, further including the step of selectively blocking access to the identity of the identified memory blocks.

* * * * *